United States Patent

Sasaki et al.

[11] Patent Number: 5,882,451
[45] Date of Patent: Mar. 16, 1999

[54] METHOD AND APPARATUS FOR APPLYING AN ELECTRONIC COMPONENT ADHESIVE

[75] Inventors: Takashi Sasaki; Naoithi Thikahisa, both of Koufu; Hiroyuki Miyake, Yamanashi-ken; Akira Iizuka; Eiichiro Terayama, both of Koufu; Yuzuru Inaba, Koufu, all of Japan

[73] Assignee: Matsushita Electric Industrial Co., Ltd., Osaka, Japan

[21] Appl. No.: 824,679

[22] Filed: Mar. 26, 1997

[30] Foreign Application Priority Data

Mar. 27, 1996 [JP] Japan ................................ 8-071572

[51] Int. Cl.$^6$ ...................................................... B05C 11/00
[52] U.S. Cl. ............................ 156/64; 156/356; 156/578; 118/697; 118/712; 427/8
[58] Field of Search ............................... 156/64, 356, 357, 156/378, 578; 118/313, 314, 315, 323, 697, 702, 712; 427/8, 9, 10

[56] References Cited

U.S. PATENT DOCUMENTS

| | | | |
|---|---|---|---|
| 3,715,258 | 2/1973 | Cunnane | 156/356 |
| 4,010,203 | 3/1977 | Aylon | 156/578 |
| 4,458,628 | 7/1984 | Fujii et al. | 118/697 |
| 4,564,410 | 1/1986 | Clitheros et al. | 156/356 |
| 4,872,417 | 10/1989 | Kuwabara et al. | 118/313 X |
| 5,110,615 | 5/1992 | Maiorca et al. | 427/8 |
| 5,292,368 | 3/1994 | Komine et al. | 118/315 |
| 5,336,357 | 8/1994 | Layher et al. | 156/578 X |
| 5,437,727 | 8/1995 | Yoneda et al. | 156/356 X |

FOREIGN PATENT DOCUMENTS

| | | | |
|---|---|---|---|
| 3064400 | 3/1988 | Japan | 156/378 |
| 5-00262 | 1/1993 | Japan | 118/315 |
| 5-293417 | 11/1993 | Japan | 118/712 |

*Primary Examiner*—James Engel
*Attorney, Agent, or Firm*—Price Gess & Ubell

[57] ABSTRACT

A method and apparatus for applying an electronic component adhesive with a minimum length of time for setting a proper application condition. Variation of application shapes of each type of the adhesive is monitored under various different application conditions and its resultant data is saved. When a desired application shape is inputted, the application nozzles are automatically controlled to apply desired doses of the adhesive under an optimum application condition which is defined by retrieving the data previously stored. Also, various different application shapes for bonding respective electronic components may be determined and saved in advance, so that a proper application condition can be automatically determined by retrieving the data on the application shapes when a desired electronic component is selected.

6 Claims, 6 Drawing Sheets

FIG. 2

| ELECTRONIC COMPONENTS | COMPONENT OUTLOOK | COMPONENT DIMENSION | | | DIAMETER OF APPLICATION SHAPE (mm) |
|---|---|---|---|---|---|
| | | X | Y | T | |
| 1.6 X 0.8 C.R | | 1.6 | 0.8 | 0.4-0.8 | φ0.7 |
| 2 X 1.25 C.R | | 2.0 | 1.25 | 0.4-0.8 | φ0.8 |
| 3.2 X 1.6 C.R | | 3.2 | 1.6 | 0.4-0.8 | |
| MINI MOLD Tr | | 2.8 | 2.8 | 1.1 | |
| MINI POWER Tr | | 4.3 | 4.5 | 1.5 | φ1.2 |
| TANTALIC CONDENSER A | | 3.8 | 1.9 | 1.6 | φ1.0 |
| TANTALIC CONDENSER B | | 4.7 | 2.6 | 2.1 | |
| TANTALIC CONDENSER C | | 6.0 | 3.2 | 2.5 | |
| TANTALIC CONDENSER D | | 7.3 | 4.3 | 2.8 | |

METHOD AND APPARATUS FOR APPLYING AN ELECTRONIC COMPONENT ADHESIVE

BACKGROUND OF THE INVENTION

1. Technical Field of the Invention

The present invention relates to a method of and an apparatus for applying an electronic component adhesive, and more particularly to a method and apparatus for intermittently applying desired doses of an electronic component adhesive in a spot-like form.

2. Description of Related Art

A conventional apparatus for applying an electronic component adhesive in desired spot shapes with intermittently actuated application nozzles comprises a plurality of application nozzles, a monitor camera, and a positioning table for locating a printed circuit board onto which doses of the adhesive are applied.

When various data on application conditions such as application points, discharging pressure of the nozzles, and discharging duration of the same is inputted to a controller of the apparatus, the controller drives the positioning table and the application nozzles to set the printed circuit board at a predetermined position and apply spots of the desired shape of the adhesive onto the printed circuit board.

However, in the above-described conventional apparatus, the various data on application conditions, e.g. discharging pressure and duration of the nozzles needs to be entered only after reviewed with the monitor camera to confirm, before the actual application, that the size or diameter of the spot shape is adequate for bonding desired electronic components. This process will take a considerable length of time and create an extra job for an operator.

SUMMARY OF THE INVENTION

It is thus an object of the present invention to provide a method and apparatus for applying an electronic component adhesive with a minimum length of time for setting application conditions hence eliminating the extra job of the operator.

To accomplish the above said object, a method of applying an electronic component adhesive of the present invention comprises the steps of: monitoring variation of application shapes of each type of the adhesive with an application condition variously changed and saving its resultant data; accessing the resultant data of the shape variation to determine an optimum application condition when a particular application shape is inputted; and controlling the application nozzles automatically to apply desired doses of the adhesive under the determined application condition. Accordingly, upon a desired application shape being entered, its related application condition is automatically set, eliminating the extra job of the operator for setting a necessary application condition.

The method may be modified to further comprise the step of preliminarily saving data on application shapes required for bonding each electronic component, so that the application nozzles are automatically controlled to apply desired doses of the adhesive under an application condition determined by retrieving the data on the application shapes when an electronic component to be bonded is selected. In the actual operation, therefore, it is only necessary to select and enter a desired electronic component in order to commence the automatic application of the adhesive in the desired shape suited for bonding the electronic component.

An apparatus for applying an electronic component adhesive according to the present invention comprises: application nozzles; a monitor camera for monitoring spot shapes of the applied adhesive; a positioning table for locating a printed circuit board onto which doses of the adhesive is applied relative to the application nozzles and the monitor camera; and a controller which includes a drive control unit for controlling movement of the application nozzles and the positioning table, an application condition memory unit for saving data on various application conditions and variation of application shapes corresponding to each application condition, and a computing unit for performing various computing operations and processes to produce and output control data to the drive control unit.

The controller may further include an application shape memory unit for saving data on application shapes required for bonding each electronic component. The apparatus having such an arrangement will perform the prescribed method of the present invention.

BRIEF DESCRIPTION OF THE DRAWINGS

FIG. 2 is a table showing an example of diameters of application shapes required for bonding respective electronic components;

DETAILED DESCRIPTION OF PREFERRED EMBODIMENT

A method and apparatus for applying an electronic component adhesive according to an embodiment of the present invention will be described hereinafter referring to FIG. 1 to 6.

Figure 5:
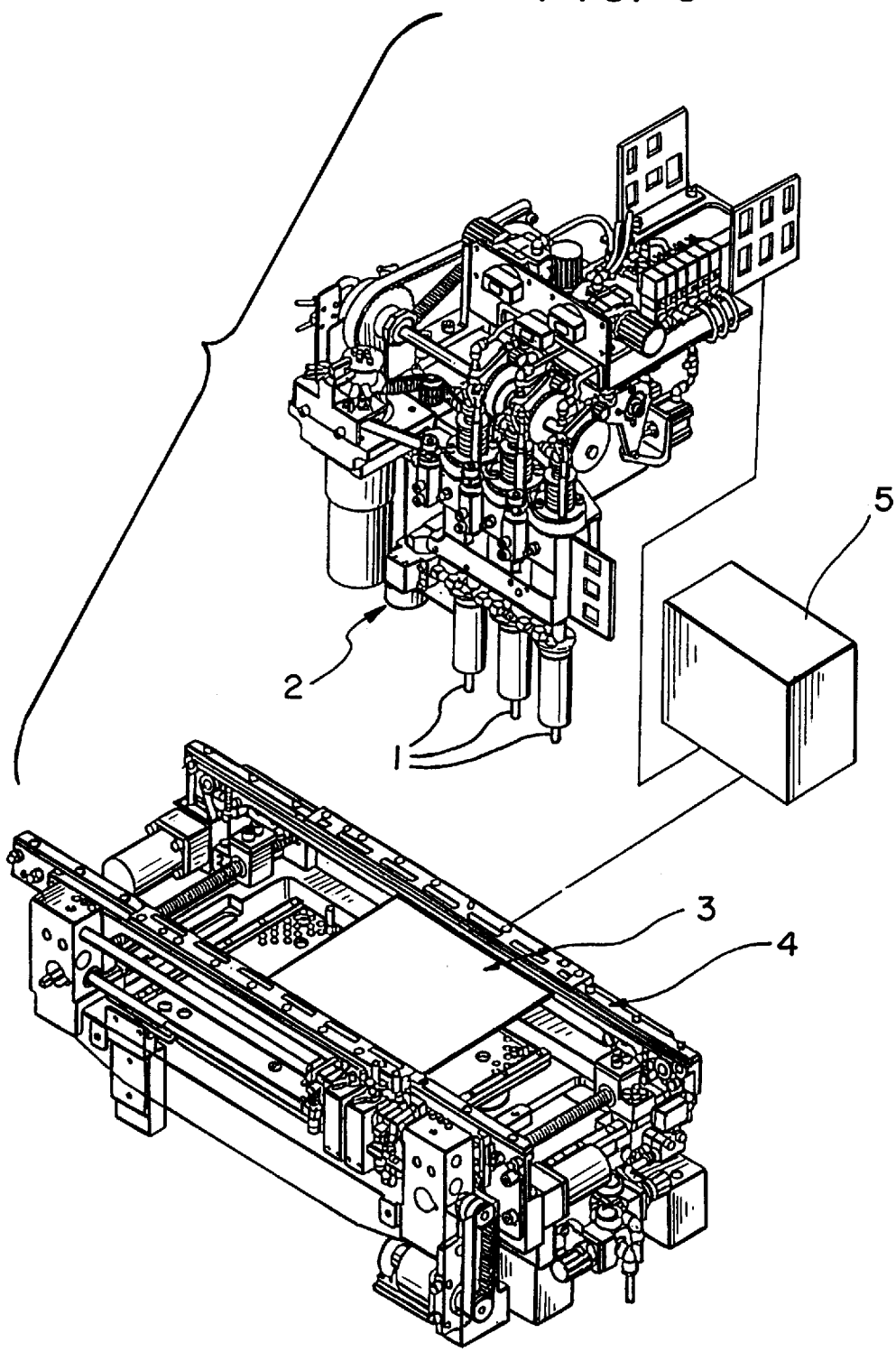
FIG. 5 is a perspective view of the whole construction of an apparatus for carrying out the method of the present invention.

The whole construction of the apparatus is illustrated in FIG. 5. As shown, the apparatus includes a plurality of application nozzles 1, a monitor camera 2, a positioning table 4 for locating a printed circuit board 3 onto which doses of an adhesive are applied, and a controller 5.

Figure 6:
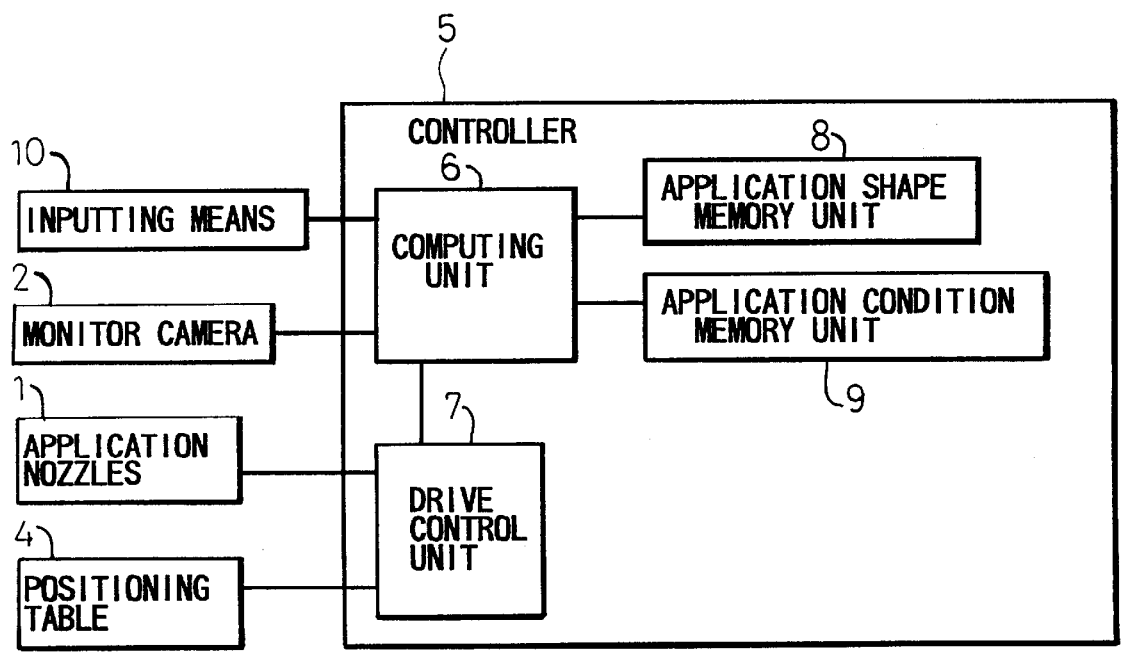
FIG. 6 is a block diagram showing the arrangement of a controller in the apparatus.

The controller 5 comprises, as shown in FIG. 6, a computing unit 6, a drive control unit 7 for outputting control signals to drive units of the application nozzles 1 and the positioning table 4, an application shape memory unit 8 for storage of data on application shapes assigned to various types of electronic components respectively, and an application condition memory unit 9 for storage of data on application conditions corresponding to various application shapes obtained through preparatory measurements. The computing unit 6 saves predetermined data in the application shape memory unit 8 and/or the application condition memory unit 9 based on commands or inputted data from an inputting means 10 and image information from the monitor camera 2. Also, the computing unit 6 calculates an application condition based on commands or inputted data from the inputting means 10, making reference to the memory data in the application shape memory unit 8 and the application condition memory unit 9 to output an application controlling signals to the drive control unit 7.

The operation of the apparatus will now be explained. Before starting the application of the adhesive, the data on recommended application shapes corresponding to each electronic component is saved in the application shape memory unit 8 at an initial step. More specifically, data on the application shapes of an adhesive required for bonding various electronic components is inputted via the inputting means 10 and stored in the application shape memory unit 8. Such data is based on preliminarily obtained data such as the data on recommended diameters of application shapes of an adhesive for each electronic component as shown in FIG. 2.

Similarly, the data on application shapes corresponding to each application condition is saved in the application condition memory unit 9. This data is obtained by setting the application nozzles 1 at desired positions over the printed circuit board 3, applying several doses of the adhesive under a particular condition, positioning the monitor camera 2 at the same location as that of the application nozzles, measuring the diameter or area of the applied doses of the adhesive on the board 3, and calculating an average value thereof. These procedures are repeated with the application conditions variously changed, and the results of the measurements are saved in the application condition memory unit 9.

Figure 3:
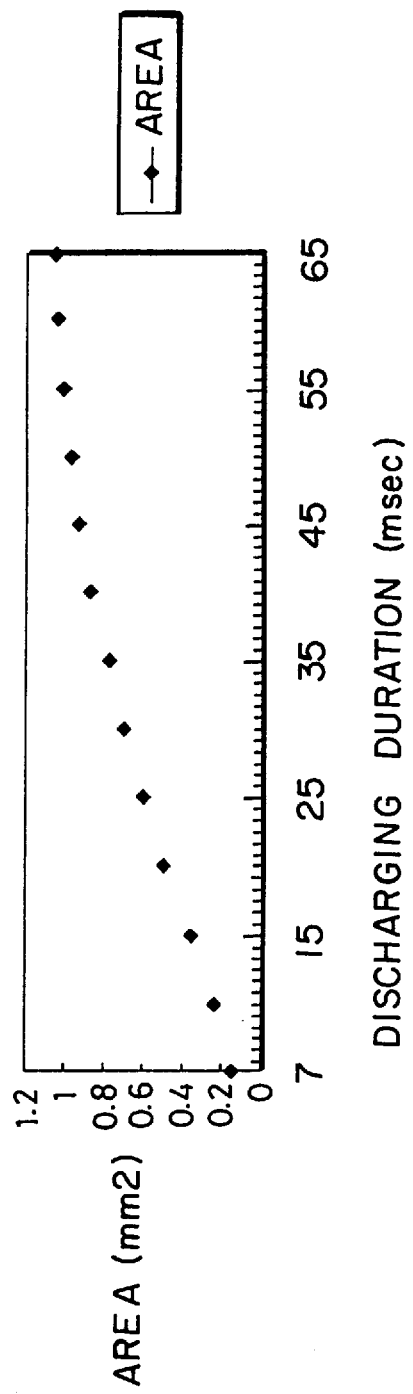
FIG. 3 is a graphic diagram showing the relation between application area and discharging duration of the application nozzles measured through experiments.
Figure 4:
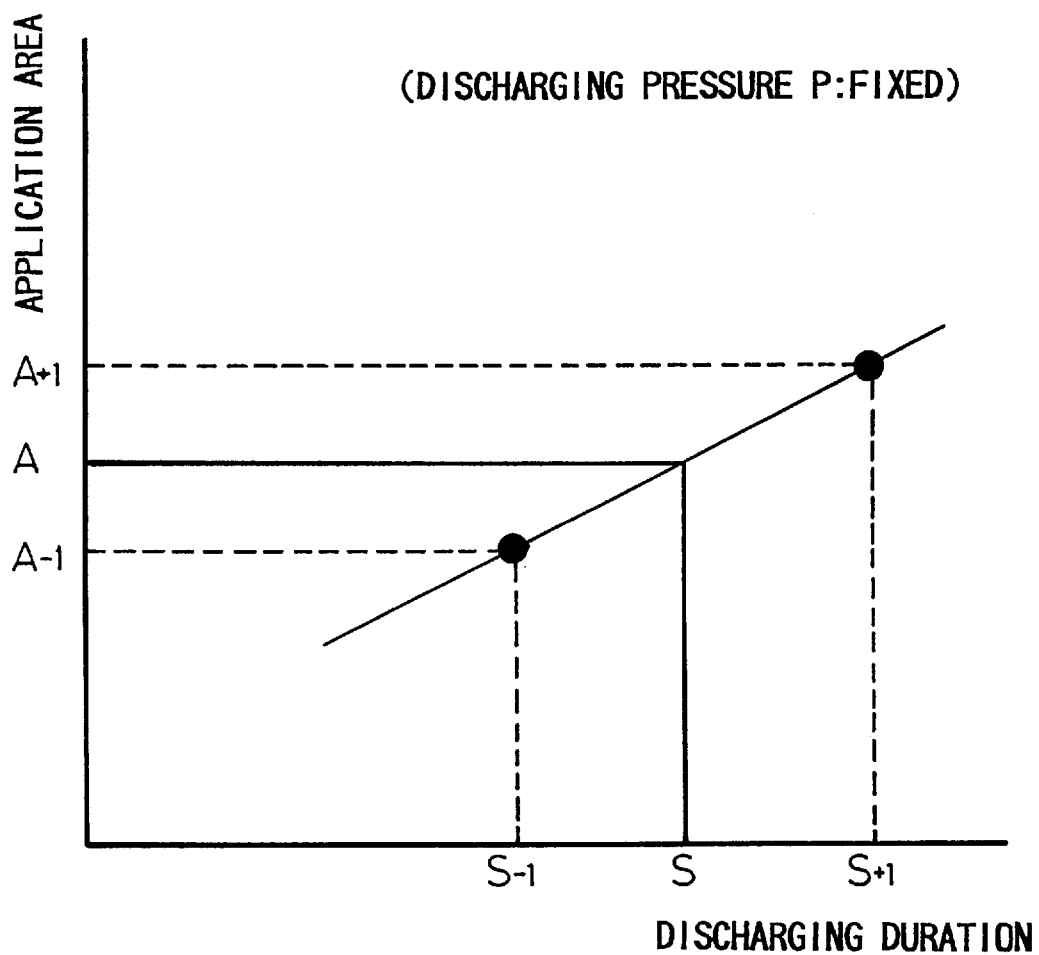
FIG. 4 is an explanatory diagram showing a calculation manner for determining an application condition.

For example, FIG. 3 shows a result of an experiment in which measurements were performed using a given adhesive under the condition wherein only the discharging duration of the nozzles 1 was changed from 7 ms to 65 ms (13 steps) while the other application conditions such as discharging pressure of the nozzles 1 were fixedly set. Average values of application areas were plotted, which had been calculated from the results of the measurements carried out 100 times at every step of the changed discharging duration of the nozzles 1. As apparent from FIG. 3, the application area varies linearly until the point where discharging duration is about 45 ms.

Figure 1:
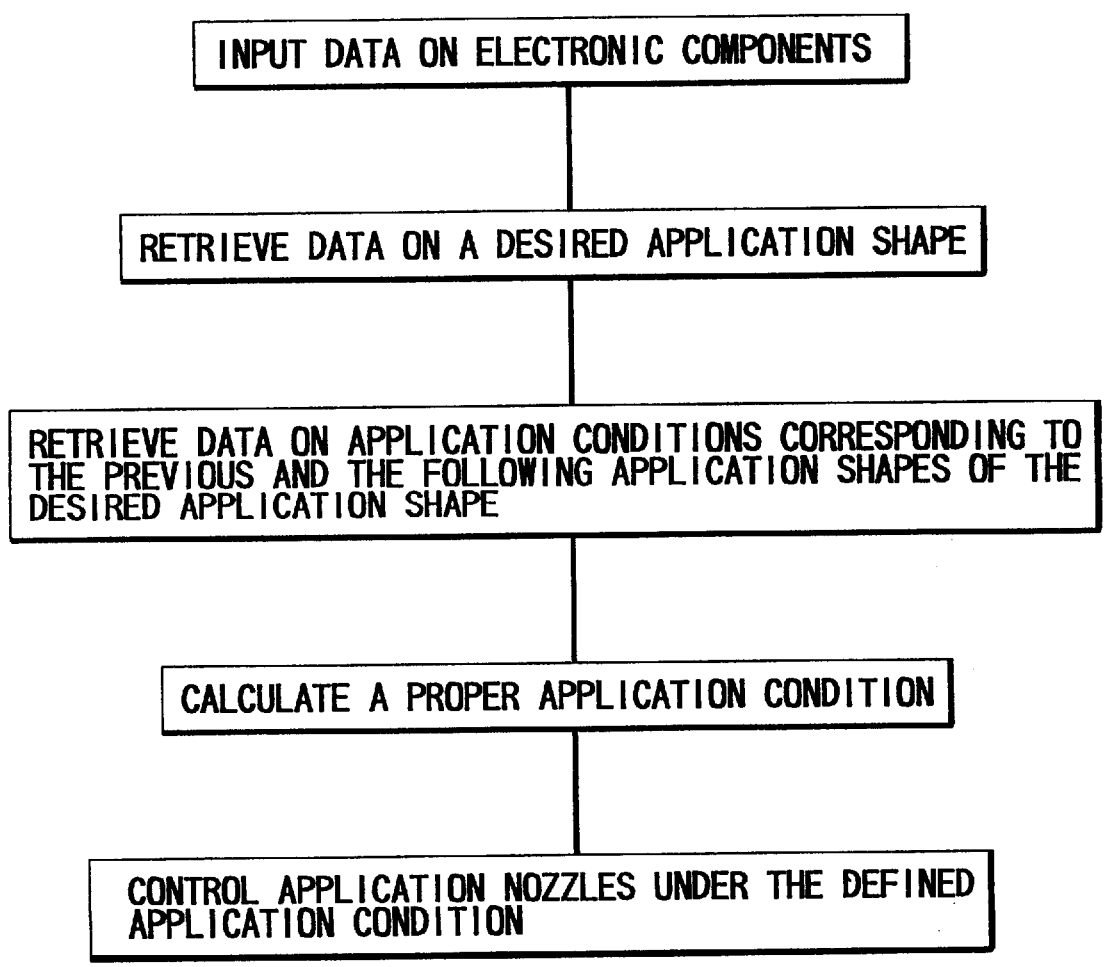
FIG. 1 is a flowchart showing a method of applying an electronic component adhesive in one embodiment of the present invention.

Nextly, the application performance in the actual operation will be explained referring to FIG. 1. The data on electronic components to be bonded is first entered via the inputting means 10. The application shape memory unit 8 is then accessed to read out the data on recommended application shapes stored therein corresponding to each of various electronic components such as the one exemplarily shown in FIG. 2. For determining a desired application condition for the read-out application shape, the application condition memory unit 9 is accessed to read out two conditions for application shapes which are the one before and the one next to the read-out application shape, and the desired application condition is thereby calculated in the following calculation manner.

Assuming that the data saved in the application condition memory unit 9 is such as shown in FIG. 3 and a recommended diameter of an application area for bonding a given electronic component is D, the application area A is defined as $A=\pi D^2/4$. The data on two application conditions (the length of discharging time in this case) $S_{-1}$ and $S_{+1}$ is retrieved for their respective application areas $A_{-1}$ and $A_{+1}$ which are before and next to the application area A from the information shown in FIG. 3. The desired application condition S for the application area A is calculated, as seen from FIG. 4, by the following equation:

$$S=S_{-1}+\{(A-A_{-1})/(A_{+1}-A_{-1})\}\times(S_{+1}-S_{-1})$$

The application nozzles 1 are then controlled based on the application condition calculated in this manner to apply necessary doses of the adhesive.

Accordingly, by only entering data on electronic components to be bonded, a desired application condition is automatically determined and used to control the application nozzles 1 to apply desired doses of the agent in a desired shape.

Although the controller 5 of this embodiment includes both the application shape memory unit 8 and the application condition memory unit 9 for determining an application condition for bonding a desired electronic component, it may have only the application condition memory unit 9 to which information on shapes of the applied adhesive is inputted for automatically determining an application condition.

As set forth above, in the method of applying an electronic component adhesive according to the present invention, variation of application shapes of each type of the adhesive with an application condition variously changed is monitored and its resultant data is preliminarily saved, whereby an optimum application condition is automatically defined and the application nozzles are automatically controlled to apply necessary doses of the adhesive only by entering data on a desired application shape. Accordingly, it is only necessary to enter data on an application shape for an electronic component to be bonded, from which an optimum application condition is automatically set, hence eliminating the extra job of the operator in the actual operation.

If the data on various different application shapes required for bonding corresponding electronic components are saved in advance, the application of the adhesive from the application nozzles can be carried out automatically under an optimum application condition only by selecting an electronic component to be bonded. In the actual operation, therefore, it is only necessary to select and enter an electronic component in order to commence the automatic application of the adhesive in the desired shape suited for bonding the electronic component.

Also, the apparatus for applying an electronic component adhesive according to the present invention has the controller which includes the drive control unit for controlling movement of the application nozzles and the positioning table, saving data on various application conditions and variation of application shapes corresponding to each application condition, and a computing unit for performing various computing operations and processes to produce and output control data to the drive control unit, and may further include the application shape memory unit for saving data on application shapes required for bonding each electronic component. Accordingly, the apparatus having such an arrangement can successfully perform the prescribed method of the present invention.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

We claim:

1. A method of applying an electronic component adhesive in a predetermined spot shape with the use of application nozzles, comprising the steps of:

preparing data preliminary to an actual operation by monitoring variation of application shapes of each type of the adhesive with application conditions variously changed;

storing resultant preliminary data;

starting the actual operation;

inputting data on a desired application shape;

accessing the stored preliminary data to determine an application condition necessary for realizing the desired application shape; and controlling the application nozzles automatically to apply desired doses of the adhesive under the determined application condition.

2. A method of applying an electronic component adhesive according to claim 1, further comprising the steps of:

storing data on application shapes required for bonding each type of various electronic components in the data preparation step;

selecting a desired type of electronic component in the inputting step; and determining a recommended application shape for bonding the selected type of electronic component in the data access step, after which the application condition is determined.

3. An apparatus which performs the method of applying an electronic component adhesive according to claim 1, comprising:

application nozzles;

a camera for recognizing spot shapes of the applied adhesive;

a positioning table for locating a printed circuit board onto which doses of the adhesive is applied relative to the application nozzles and the camera; and a controller which includes a drive control unit for controlling movement of the application nozzles and the positioning table;

an application condition memory unit for saving data on various application conditions and variation of application shapes corresponding to each application condition; and a computing unit for performing various computing operations and processes to produce and output control data to the drive control unit.

4. An apparatus for applying an electronic component adhesive according to claim 3, wherein the controller further includes an application shape memory unit for saving data on application shapes required for bonding each of various electronic components.

5. A method of applying an electronic component adhesive in a predetermined spot shape with the use of application nozzles, comprising the steps of:

registering a variety of application adhesive shapes recommended for each type of electronic components to be bonded in a memory unit;

preparing and storing a data on a relationship between the application adhesive shapes and various application conditions which is obtained through test applications;

starting the actual operation;

inputting a desired type of electronic component to be bonded;

accessing the data on recommended application adhesive shapes corresponding to each type of electronic components and reading an application adhesive shape recommended for bonding the inputted type of electronic component;

accessing the data on application conditions and reading two application conditions in a data table respectively corresponding to application shapes adjacent to the recommended application adhesive shape which has been read in the previous step;

calculating an application condition for realizing the desired shape of application using the retrieved data; and carrying out adhesive application under the determined application condition.

6. An apparatus for adhering an electronic component to a support surface, comprising:

application nozzles for dispensing a flowable material to the support surface for securing the electronic component;

a monitor camera for monitoring the dimension of the flowable material on the support surface;

a positioning table for locating the support surface relative to the application nozzles;

a controller for controlling movement of the application nozzles and work surface;

an application condition memory unit having stored therein application conditions for various dimensions of flowable material on the support surface;

a user input device for inputting data on a desired application shape for an electronic component; and a computing unit for computing the selection of nozzle, the position of the support surface, a pressure for the flowable material, and a duration of time for applying the flowable material from the stored data in the application condition memory unit, and the user inputted data.

* * * * *